US012625766B2

(12) United States Patent
Ayyapureddi

(10) Patent No.: US 12,625,766 B2
(45) Date of Patent: May 12, 2026

(54) SEMICONDUCTOR MEMORY DEVICE-DIRECTED ERROR CHECK AND SCRUB

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 18/789,201

(22) Filed: Jul. 30, 2024

(65) Prior Publication Data

US 2025/0130897 A1      Apr. 24, 2025

Related U.S. Application Data

(60) Provisional application No. 63/545,021, filed on Oct. 20, 2023.

(51) Int. Cl.
| | |
|---|---|
| *G06F 11/10* | (2006.01) |
| *G06F 11/26* | (2006.01) |
| *G06F 11/273* | (2006.01) |
| *G11C 11/406* | (2006.01) |
| *G11C 29/42* | (2006.01) |
| *G11C 29/56* | (2006.01) |

(52) U.S. Cl.
CPC ...... *G06F 11/1068* (2013.01); *G06F 11/1016* (2013.01); *G06F 11/1048* (2013.01); *G06F 11/106* (2013.01); *G06F 11/26* (2013.01); *G06F 11/2736* (2013.01); *G11C 11/406* (2013.01); *G11C 29/42* (2013.01); *G11C 29/56* (2013.01); *G11C 2211/4062* (2013.01)

(58) Field of Classification Search
CPC ............ G06F 11/1068; G06F 11/1016; G06F 11/1048; G06F 11/106; G06F 11/26; G06F 11/2736; G11C 29/42; G11C 29/56; G11C 11/406; G11C 2211/4062
See application file for complete search history.

(56) References Cited

U.S. PATENT DOCUMENTS

| | | | | |
|---|---|---|---|---|
| 2018/0322008 A1* | 11/2018 | Chung | ................ | G06F 3/0679 |
| 2019/0073261 A1* | 3/2019 | Halbert | ................ | G06F 3/0679 |
| 2020/0210278 A1* | 7/2020 | Rooney | .............. | G06F 11/1004 |
| 2020/0401476 A1* | 12/2020 | Cha | ........................ | G06F 11/076 |
| 2021/0286670 A1* | 9/2021 | Rooney | ................ | G06F 11/106 |
| 2023/0185473 A1* | 6/2023 | Choi | ..................... | G06F 3/0652 |
| | | | | 711/154 |
| 2024/0004755 A1* | 1/2024 | Rooney | .............. | G06F 11/1068 |
| 2024/0370336 A1* | 11/2024 | Rooney | .............. | G11C 11/4087 |
| 2025/0130897 A1* | 4/2025 | Ayyapureddi | ...... | G06F 11/1016 |

* cited by examiner

*Primary Examiner* — John J Tabone, Jr.

(74) *Attorney, Agent, or Firm* — Dorsey & Whitney LLP

(57) ABSTRACT

Methods, systems, and apparatuses for a memory device (e.g., DRAM) including a directed error check and scrub (ECS) procedure are described. The directed ECS procedure may include read-modify-write cycles when errors are detected in code words. In some embodiments, the memory device may perform the directed ECS procedure on a code word in which an error was previously detected (for example, in response to a read command). The directed ECS procedure described herein may facilitate correcting code word errors before too many errors, exceeding the detection and/or correction capabilities of the memory device, accumulate in the code words.

18 Claims, 6 Drawing Sheets

600

SEMICONDUCTOR MEMORY DEVICE-DIRECTED ERROR CHECK AND SCRUB

CROSS-REFERENCE TO RELATED APPLICATION(S)

The present application claims priority to U.S. Provisional Patent Application No. 63/545,021, filed Oct. 20, 2023, the disclosure of which is incorporated herein by reference in its entirety.

TECHNICAL FIELD

The present disclosure generally relates to a memory device, and more specifically, relates to error check and scrub directed by a semiconductor memory device.

BACKGROUND

Memory devices are widely used to store information related to various electronic devices such as computers, wireless communication devices, cameras, digital displays, and the like. Memory devices may be volatile or non-volatile and can be of various types, such as magnetic hard disks, random access memory (RAM), read-only memory (ROM), dynamic RAM (DRAM), synchronous dynamic RAM (SDRAM), and others. Information is stored in various types of RAM by charging a memory cell to have different states. Improving RAM memory devices, generally, can include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
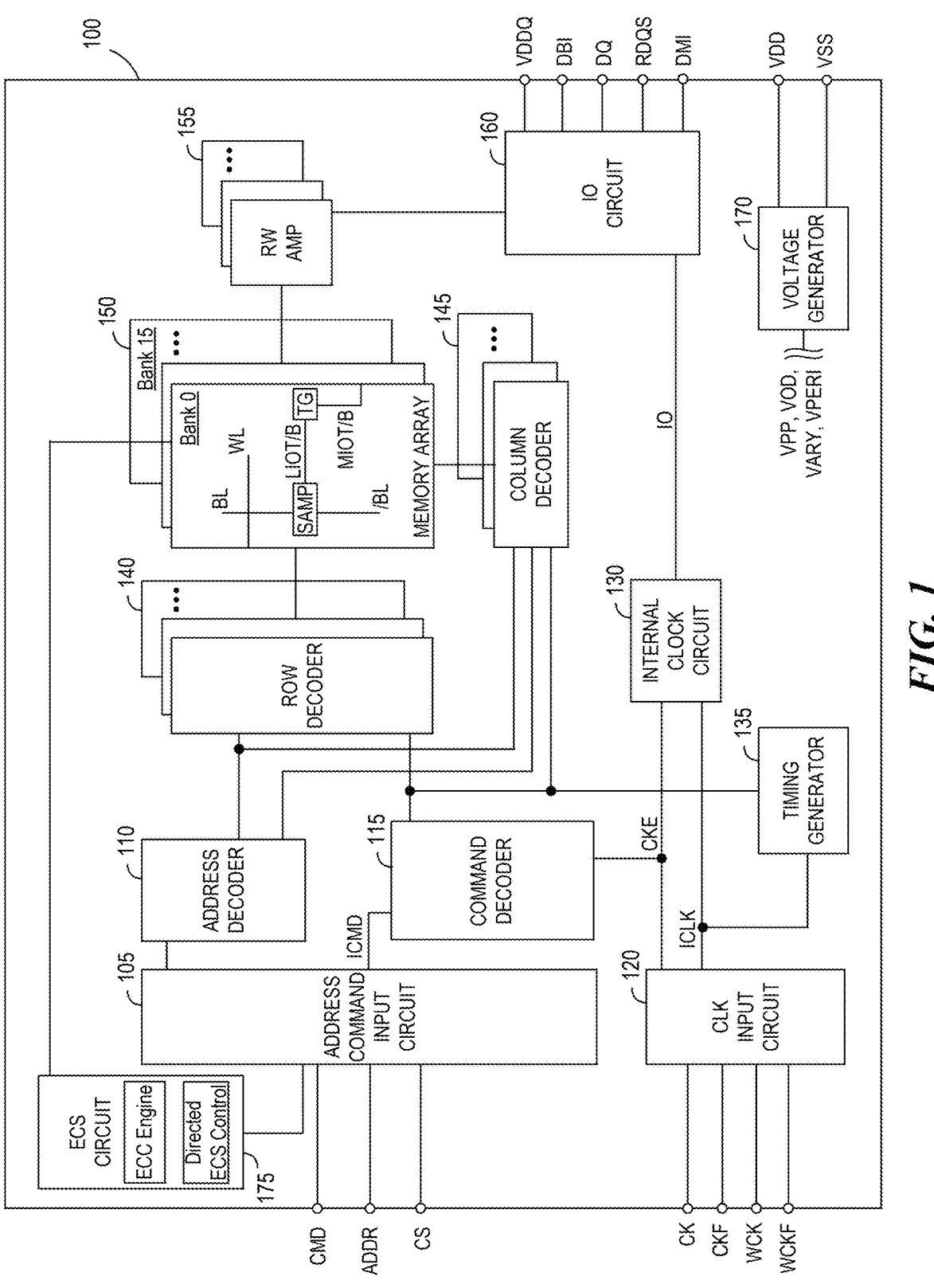
FIG. 1 illustrates a simplified block diagram schematically illustrating a memory device in accordance with an embodiment of the present technology.

Methods, systems, and apparatuses for semiconductor memory devices (e.g., DRAM) are disclosed, which include an error check and scrub (ECS) procedure that may be directed by the memory devices (i.e., memory devices with directed ECS). The described ECS procedure may be regarded as "directed" by the memory devices in that the ECS procedure may be performed in response to information from the memory devices (e.g., indicating the detection of an error in the memory device). The described ECS procedure may be further regarded as "directed" by the memory devices in that the ECS procedure may prioritize operating on memory device addresses identified by the memory devices (e.g., memory device addresses where errors have been detected).

Some semiconductor memory devices, such as DRAM, store information as a charge accumulated in cell capacitors ("cells"), with the cells organized into rows. The charge accumulated in the cell capacitors may escape from the cell capacitor (which may be referred to as "leakage") to surrounding components connected to the cell capacitor (e.g., metal lines, semiconductor junctions of switching transistors) due to a voltage difference between the capacitor and the surrounding components, in some cases. As a result, a cell's charge may change. A cell's charge may also change in response to a particle strike.

Errors may occur if a cell's charge has changed enough that the charge is interpreted as a wrong logic value (i.e., the bit has "flipped" from a correct logic value, resulting in a bit "flip" error or bit error). In some cases, memory devices may be configured to perform an error-correction code (ECC) function (e.g., using an on-die ECC engine or ECC circuit) that can detect and correct one or more errors in data stored in the memory array (e.g., a code word). In some cases, the ECC function is performed as part of a read operation of the memory device (e.g., in response to a read command issued from a host coupled to the memory device), such that corrected read data is provided to the host. However, in conventional memory devices, corrected read data generated by the ECC function during a read operation is not written back to the memory device (i.e., the corrected data is sent to the host, but errors will remain in the data resident in the memory device itself). In some cases, the ECC function is performed as part of an ECS operation, in which the memory device reads data bits, corrects errors that are detected (e.g., using the ECC function), and writes back the corrected data bits to the memory device. That is, the ECS operation scrubs the memory device for errors.

The ECS operation may involve performing an ECS procedure one or more times, where each ECS procedure operates on a portion of a memory device. For example, an ECS procedure may operate on a code word (e.g., 128 data bits and additional check bits) that represents a portion of a row of the memory device. The ECS procedure may perform an internal read-modify-write cycle, in which the ECS procedure reads the code word from the memory device, corrects detected error(s) in the code word, and writes the correct code word back to the memory device. An ECS procedure can be initiated in response to a command, received from a host device coupled with the memory devices, to perform an ECS procedure ("manual ECS"). An ECS procedure can additionally be initiated automatically—e.g., without receiving a command from a host device ("automatic ECS").

In conventional memory devices with ECS, an ECS procedure performs the internal read-modify-write cycle on an address determined based on ECS address counters. For example, the code word on which the ECS procedure's internal read-modify-write cycle is performed can be based on an address in a column counter, row counter, bank counter, and/or bank group counter. After an ECS procedure completes (e.g., after the write of the internal read-modify-write cycle), the column counter is incremented such that the next code word is selected for the next ECS procedure. Once the column counter wraps (i.e., all code words on the row have been accessed), the row counter increments until all code words on each of the rows within a bank are accessed. When the row counter wraps (i.e., all rows within the bank have been accessed), the bank counter increments and the next bank within a bank group repeats the process of accessing each code word. When the bank counter wraps, the bank group counter increments and the next bank group repeats the process of accessing each code word, until all bank groups have been accessed. Once the bank group counter wraps, all the code words within the device have been evaluated by the internal read-modify-write cycle, and the ECS operation will begin anew (e.g., at a starting column, row, bank, and/or bank group) with the next ECS procedure. That is, successive ECS procedures will operate on the next code words based on the incremented ECS address counters, where the number of ECS procedures to complete an ECS operation for an entire memory device depends on the number of code words per memory device.

Conventional memory devices with ECS may be configured to perform a complete ECS operation (e.g., to perform ECS procedures at every code word of the device) over a recommended period, such as every 24 hours. That is, for example, a host coupled to the memory device may be configured to issue commands for manual ECS at a frequency sufficient to scrub the entire memory device within 24 hours, and/or the memory device may be configured to perform automatic ECS at a frequency sufficient to scrub the entire memory device within 24 hours. As a result, in a conventional memory device with ECS, a significant period of time may elapse between scrubs of a particular code word (e.g., once every 24 hours). This delay, however, can increase the likelihood of having a quantity of errors in the data (e.g., the code word) that exceeds the correction capacity of the ECC function. For example, the ECC function may only be capable of detecting single-bit errors in a code word and suffer from certain shortcomings if two or more bit errors are present in a code word. For example, if the ECC function only capable of detecting a single-bit error is presented with a code word with two bit errors, it may interpret the code word as having a single-bit error at some location other than the location of the two actual bit errors, thereby resulting in aliasing. It would therefore be advantageous to prioritize scrubbing code words that have single-bit errors. By doing so, the likelihood of a code word accumulating two or more bit errors, which could exceed the detection and/or correction capability of the ECC function, is reduced.

Accordingly, described herein are memory devices with directed ECS that scrub code words (i.e., perform an ECS procedure on the code words) when errors are detected. Like conventional memory devices, the memory device with directed ECS performs an ECC function on data read from the memory device in response to a host read request and corrects detected errors before the data is transmitted to the host. Unlike conventional memory devices, the memory device with directed ECS additionally notifies the host if any errors were detected in the read data. As described herein, the memory device with directed ECS can notify the host of the detected error via a dedicated pin (e.g., a Data Mask (DM) pin of the memory device, when the memory device is coupled to the host via a Compute Express Link (CXL) interface) and/or a shared bus (e.g., a sideband bus shared by memory devices that comply with Double Data Rate Synchronous Dynamic Random Access Memory (DDR SDRAM) standards, such as DDR6). In some embodiments the indication additionally includes information identifying which memory device detected the error. For example, the memory device can notify the host (e.g., using a pin, a sideband bus, etc.) the identification of the memory device. In some embodiments, the notification of a detected error is sent to the host without an indication of a specific memory device. For example, the host may determine the rank associated with the DRAM device error. When the host receives an indication of the detected error (e.g., via the DM pin and/or sideband bus), it may initiate a manual ECS operation. Furthermore, the host may initiate the manual ECS, in response to the error indication, sooner than it ordinarily would have next initiated manual ECS (e.g., sooner than would be necessary to complete the ECS operation of the memory device within the recommended period).

Additionally, when the memory device with directed ECS detects an error during a data read, the memory device can store information regarding the address of the detected error. For example, the memory device with directed ECS can save the column, row, bank, and/or bank group address of the code word in which an error was detected during the read. Additionally, the memory device with directed ECS can save a bit (e.g., a valid bit) to indicate that the address of a code word in which an error has been detected has been saved. The information (e.g., the code word address and valid bit) can be saved in a mode register for directed ECS. In some embodiments the memory device with directed ECS includes multiple directed ECS mode registers, such that the address of multiple code words in the memory device can be stored.

When the memory device with directed ECS performs an ECS procedure (e.g., in response to manual ECS or automatic ECS), it evaluates whether the address of any previously detected errors has been saved. For example, it can evaluate whether the valid bit in any of the directed ECS mode registers is set. If the address of any previously detected errors has been saved (e.g., the valid bit of a directed ECS mode register is set), the memory device with directed ECS performs the ECS procedure on the corresponding address (e.g., the address at the row, column, bank, and/or bank group stored in the ECS mode register) instead of the address identified by the ECS address counters. By doing so, the memory device with directed ECS performs, on a prioritized basis, the scrub operation on the code word in which an error was detected. As a result, the memory device with directed ECS reduces the likelihood that another error occurs in the code word before it is scrubbed. After the ECS procedure completes, the memory device with directed ECS clears the valid bit of the directed ECS mode register corresponding to the scrubbed address, such that the address no longer flags the need for directed ECS. When an ECS procedure is again performed, if none of the ECS mode register valid bits are set, the memory device with directed ECS will perform the ECS procedure according to the ECS address counters (e.g., conventionally). In embodiments with multiple ECS mode registers storing the addresses of multiple detected errors, the memory device with directed ECS may prioritize among the addresses saved in the ECS mode registers based on which is oldest (e.g., which address, yet to be scrubbed, was first detected during a data read).

FIG. 1 illustrates a simplified block diagram schematically illustrating a memory device 100 in accordance with embodiments of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local input/output (I/O) line pair (LIOT/B), which may in turn be coupled to at least one respective main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via an address/command input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the address/command input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown in FIG. 1).

The command decoder 115, in some embodiments, may further include one or more registers for tracking various counts or values (e.g., counts of refresh commands received by the memory device 100 or self-refresh operations performed by the memory device 100). In some embodiments, a subset of registers may be referred to as mode registers and configured to store user-defined variables to provide flexibility in performing various functions, features, and modes. For example, the memory device may receive a signaling from a host device at the mode registers indicating whether an ECC mode of the memory device is enabled or disabled.

When a read command is issued to a bank with an open row and a column address is timely supplied as part of the read command, read data can be read from memory cells in the memory array 150 designated by the row address (which may have been provided as part of the Activate command identifying the open row) and column address. The read command may be received by the command decoder 115, which can provide internal commands to IO circuit 160 so that read data can be output from the data terminals DQ, RDQS, DBI, and DMI via read/write amplifiers 155 and the IO circuit 160 according to the RDQS clock signals. The memory device 100 may perform an ECC function (e.g., to detect and correct errors) on the data read from the memory array 150 using an ECC circuit (described below) prior to outputting the read data from the data terminals. The read data may be provided at a time defined by read latency information (RL) that can be programmed in the memory device 100, for example, in a mode register. The read latency information RL can be defined in terms of clock cycles of the CK clock signal. For example, the read latency information RL can be a number of clock cycles of the CK signal after the read command is received by the memory device 100, when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the IO circuit 160 so that the write data can be received by data receivers in the IO circuit 160 and supplied via the IO circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in a mode register. The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the IO circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 160 so that power supply noise generated by the IO circuit 160 does not propagate to the other circuit blocks.

The on-die termination terminal(s) may be supplied with an on-die termination signal ODT. The on-die termination signal ODT can be supplied to the IO circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase- and frequency-controlled internal clock signals based on the received internal clock signals ICLK and a clock enable signal CKE from the command decoder 115. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the IO circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135, and thus various internal clock signals can be generated.

The memory device 100 additionally includes an ECS circuit 175. The ECS circuit 175 may include an ECC engine and/or control for directed ECS. The ECS circuit 175 (in conjunction with the address/command input circuit 105) may be configured to determine when the memory device 100 has received a read command directed to the memory array 150 and perform an ECC function (e.g., using the ECC engine) to detect and correct errors in data read from the memory array. If the ECS circuit 175 detects an error in data read from the memory array 150 in response to a read command, the memory device 100 may notify the host and/or controller that issued the read command than an error was detected. The memory device 100 may notify the host through a DM pin and/or sideband bus coupled to the memory device (not shown). The notification of a detected error may additionally include an identifier associated with the memory device 100 (e.g., to identify the memory device from other memory devices also coupled to the host). If the ECS circuit 175 detects an error in data read from the memory array 150 in response to a read command, the ECS engine may additionally record information regarding the detected error in directed ECS mode registers (not shown), which may be part of the directed ECS control. For example, the ECS circuit 175 may store the column, row, bank, and/or bank group addresses of the code words in which errors were detected, in data read from the memory array 150, to the directed ECS mode registers. The ECS circuit 175 may also set a valid bit associated with the directed ECS mode registers to indicate that the corresponding directed ECS mode register contains valid data (e.g., the address of a code word in which an error has been detected, but that has not yet been scrubbed). In some embodiments, the memory device 100 includes a single directed ECS mode register such that it can only store the address of one code word at a time. In some embodiments, the memory device 100 includes multiple directed ECS mode registers such that it can store the address of multiple code words at once (e.g., multiple code words in which an error has been detected but that have not yet been scrubbed). In some embodiments in which the memory device 100 includes multiple directed ECS mode registers, the ECS circuit 175 can store the addresses of multiple code words to the directed ECS mode registers in response to a single read command from a host, if multiple code words in the data read from memory array 150 have errors.

The ECS circuit (in conjunction with the address/command input circuit 105) may be additionally configured to receive scrub commands (e.g., from a host device or controller coupled with the memory device 100) directed to the memory array 150 and perform an ECS procedure. In some embodiments, the ECS circuit 175 may be configured to perform an ECS procedure automatically (e.g., as a background operation). When the ECS circuit 175 performs an ECS procedure (e.g., in response to a scrub command from a host device and/or an automatically initiated procedure), the directed ECS control of the ECS circuit determines the address of the memory array 150 on which the ECS procedure should be performed. For example, if the directed ECS control determines that there are code words in the memory array 150 for which an error has been detected but that have not yet been scrubbed (e.g., there is valid data in one or more directed ECS mode registers), the directed ECS control selects one of those code words (e.g., corresponding to the least recently written valid directed ECS mode register) for the ECS procedure. If the directed ECS control determines that there are no code words in the memory array 150 for which an error has been detected and have not yet been scrubbed (e.g., there is no valid data in any of the directed ECS mode registers), the directed ECS control selects an alternative code word for the ECS procedure. For example, the ECS control can select a code word based on ECS address counters (not shown), that iterate through the addresses of the memory array 150. Data may then be retrieved from the memory array 150 based on a determination made by the directed ECS control (e.g., at an address corresponding to a directed ECS mode register or ECS address counters).

Subsequently, the memory device 100 (e.g., the ECS circuit 175) may detect and correct one or more errors in the code word of the retrieved data. In some embodiments, the memory device 100 may utilize an ECC circuit (e.g., the ECC engine included in the ECS circuit 175) to detect and correct the one or more errors. The corrected code word may be written back to the memory array 150, thereby completing an internal read-modify-write cycle of the ECS procedure. After the corrected code word has been written back to the memory array 150 (e.g., after the internal read-modify-write cycle of the ECS procedure has completed), the ECS circuit 175 may update the directed ECS mode registers accordingly. For example, the ECS circuit 175 may update the directed ECS mode register corresponding to the code word that was scrubbed by the current ECS procedure (e.g., the ECS mode register storing the code word's address) so that the directed ECS mode register no longer appears to have valid data (e.g., by clearing the register's valid bit). That is, the updated directed ECS mode register will no longer report a code word for which an error has been detected but that has not yet been scrubbed (since the corresponding code word was scrubbed by the current ECS procedure).

Figure 2:
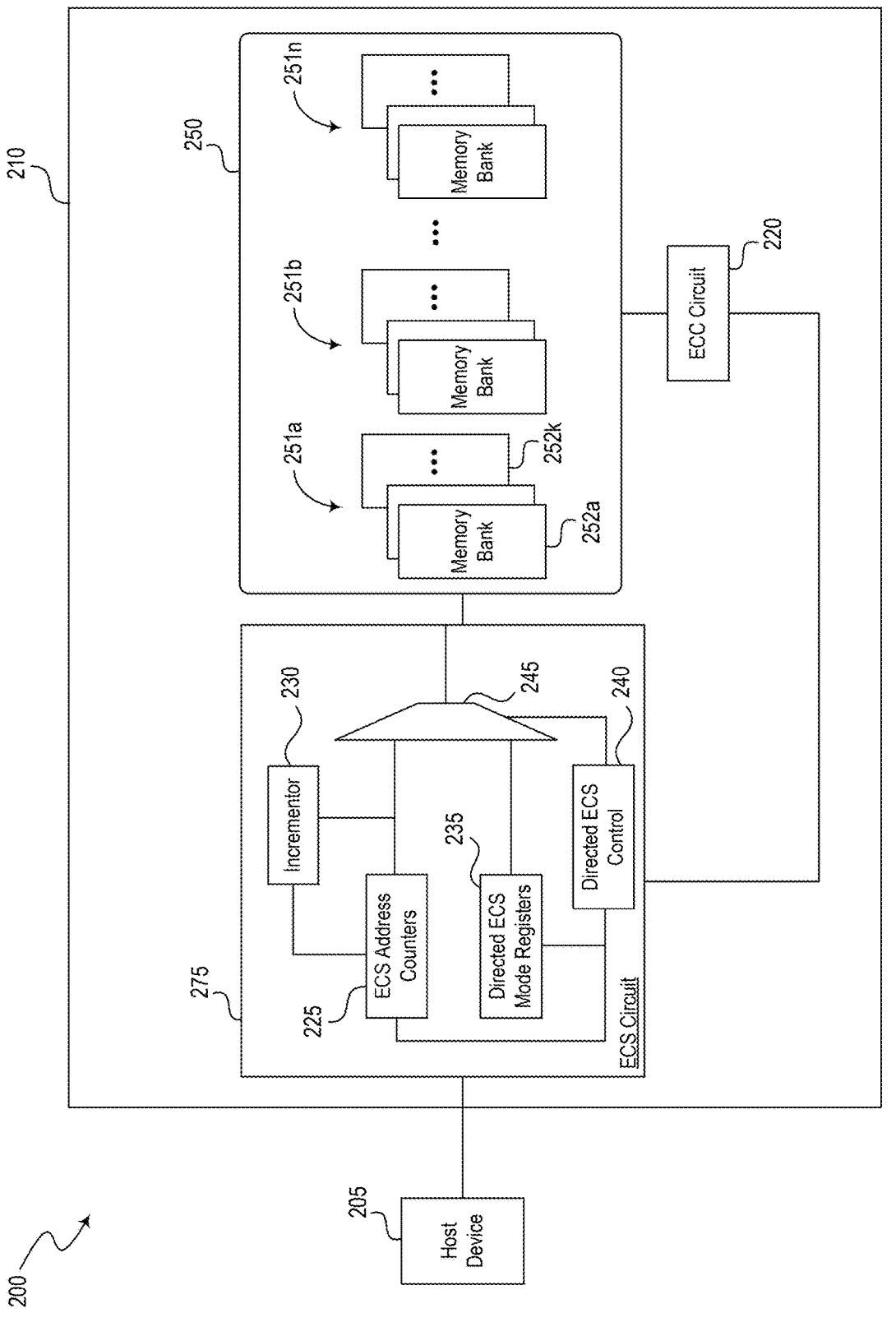
FIG. 2 is a simplified block diagram of an example memory device illustrating various components for performing an error check and scrub (ECS) procedure in accordance with an embodiment of the present disclosure.

FIG. 2 is a block diagram 200 schematically illustrating a memory device 210 in accordance with an embodiment of the present technology. The block diagram 200 also illustrates a host device 205 coupled with the memory device 210. The memory device 210 may be an example of or include aspects of the memory device 100 described with reference to FIG. 1. The memory device 210 may include an ECS circuit 275 (which may be an example of or include aspects of the ECS circuit 175), an ECC circuit 220 (which may be an example of or include aspects of the ECC engine described with reference to FIG. 1), and a memory array 250 (which may be an example of, or include aspects of, the memory array 150). The ECS circuit 275 may include ECS address counters 225, address incrementor 230, directed ECS mode registers 235, directed ECS control 240, and ECS multiplexor 245. As described herein, the ECS circuit 275 may be configured to perform an ECS procedure on a code word (i.e., scrub the code word) identified by the ECS address counters 225 or directed ECS mode registers 235. Further, the ECC circuit 220 may be configured to perform an ECC function on a code word as part of an ECS procedure, as well as during a read of the memory array 250 (e.g., as requested by the host 205).

The memory array 250 may be configured to include a quantity of bank groups 251 (e.g., bank groups 251a through 251n). Each individual bank group 251 may include a set of banks of memory cells (e.g., banks 252a through 252k in the bank group 251a). Each individual bank of memory cells (e.g., the bank 252a) may include a set of rows, where each row includes a set of addresses (e.g., columns) that each may correspond to a code word. For example, a row may include 128 addresses (or columns) that each correspond to a code word with 8 bytes. That is, the row may include 1,024 bytes of data, in this example.

During a read of the memory array 250 (e.g., in response to a read request from the host 205), the ECC circuit 220 may be configured to perform an ECC function on the read data to detect and correct errors before transmitting the data to the host. That is, the ECC circuit 220 may detect code words in the read data that have one or more bits flipped and correct those flipped bits before transmitting to the host. However, the corrected code words may not be written back to the memory array 250 immediately. Instead, the address of code words in which errors were detected may be stored in the directed ECS mode registers 235. For example, the bank group, bank, row, and column address of any code words in which an error was detected by the ECC circuit 220, when performing the ECC function on the read data, may be stored in the directed ECS mode registers 235. A flag (e.g., valid bit) may also be set in individual directed ECS mode registers 235 to indicate that the corresponding mode register has valid data (e.g., the address of a code word in which an error was detected). Additionally, the memory device 210 (e.g., via the ECC circuit 220 and/or ECS circuit 275) may notify the host 205 that any errors were detected in the data read from the memory array 250.

When the ECS circuit 275 is to perform an ECS procedure (e.g., in response to a manual ECS request received from the host 205 and/or when the ECS circuit or other element of the memory device 210 automatically triggers ECS), the directed ECS control 240 determines the code word address on which the ECS procedure is to be performed. If the directed ECS control 240 detects that the directed ECS mode registers 235 contain any valid data (indicating at least one register contains the address of a code word in which an error was detected but which has not yet been scrubbed), the directed ECS control may configure the ECS multiplexor 245 to select a code word address (e.g., bank group, bank, row, and/or column) from a directed ECS mode register with valid data. If multiple directed ECS mode registers 235 contain valid data (e.g., errors have been detected in multiple code words that have yet to be scrubbed), the directed ECS control 240 may configure the ECS multiplexor 245 to select the directed ECS mode register 235 with the oldest valid data. In embodiments with multiple directed ECS mode registers 235, other approaches may be used to select an ECS mode register when multiple ECS mode registers have valid data (e.g., first in, first out (FIFO), round-robin selection, random selection, and/or prioritizing certain ECS mode registers). That is, although FIG. 2 illustrates that the directed ECS mode registers 235 are coupled to only a single input of the ECS multiplexor 245, the ECS multiplexor may actually be coupled to and select from any of the ECS mode registers (e.g., the ECS multiplexor may be many-to-one, instead of two-to-one as illustrated). If, however, the directed ECS control 240 detects that none of the directed ECS mode registers 235 contain valid data, the directed ECS control may configure the ECS multiplexor 245 to select a code word address (e.g., bank group, bank, row, and/or column) from the ECS address counters 225.

The output of the ECS multiplexor 245 (as selected by the directed ECS control 240) includes the address information of the code word in the memory array 250 on which the ECS procedure is to be performed. The memory device 210 (including the ECS circuit 275 and ECC circuit 220) reads the code word from the memory array 250, performs an ECC function to detect and correct any errors in the code word, and writes any corrected data back to the code word's address in the memory array, thereby completing an internal read-modify-write cycle. It will be appreciated that if the ECS procedure was performed on a code word selected by the ECS address counters 225, the ECS procedure may not detect any errors in the code word (since, as described above, the ECS address counters iterate through all addresses in the memory array 250, the majority of which should have no error present). However if the ECS procedure was performed on a code word selected by the directed ECS mode registers 235, then the ECS procedure should detect an error in the code word (e.g., the error resulting in the code word's address being saved in the directed ECS mode registers) and correct it. Advantageously, the directed scrub of a code word improves the likelihood of correcting errors in the code word before more errors than can be detected and/or corrected (e.g., by the ECC circuit 220) accumulate in the code word. For example, a single-bit error can be corrected (before a double-bit error occurs) if the ECC circuit 220 can only detect and/or correct single-bit errors, a double-bit error can be corrected (before a triple-bit error occurs) if the ECC circuit can only detect and/or correct up to double-bit errors, etc.

After the internal read-modify-write cycle of the ECS procedure has completed (e.g., corrected data has been written back to the code word's address in the memory array 250), the ECS circuit 275 updates state accordingly. For example, if the ECS procedure was performed on a code word address stored in a directed ECS mode register 235, the directed ECS control 240 may update the directed ECS mode register such that it no longer indicates storing valid data (e.g., clears the valid bit associated with the register). If the ECS procedure was performed on a code word address from the ECS address counters 225, the directed ECS control 240 may update the ECS address counters with the next incremented address (e.g., generated by the address incrementor 230). As described herein, the ECS address counters 225 and/or address incrementor 230 may be configured such that the address in the ECS address counters iterates through all addresses of the memory array 250 with a sufficient number of increments (e.g., iterating through all columns within a row, all rows within a bank, all banks within a bank group, and all bank groups within the memory device 210).

Figure 3:
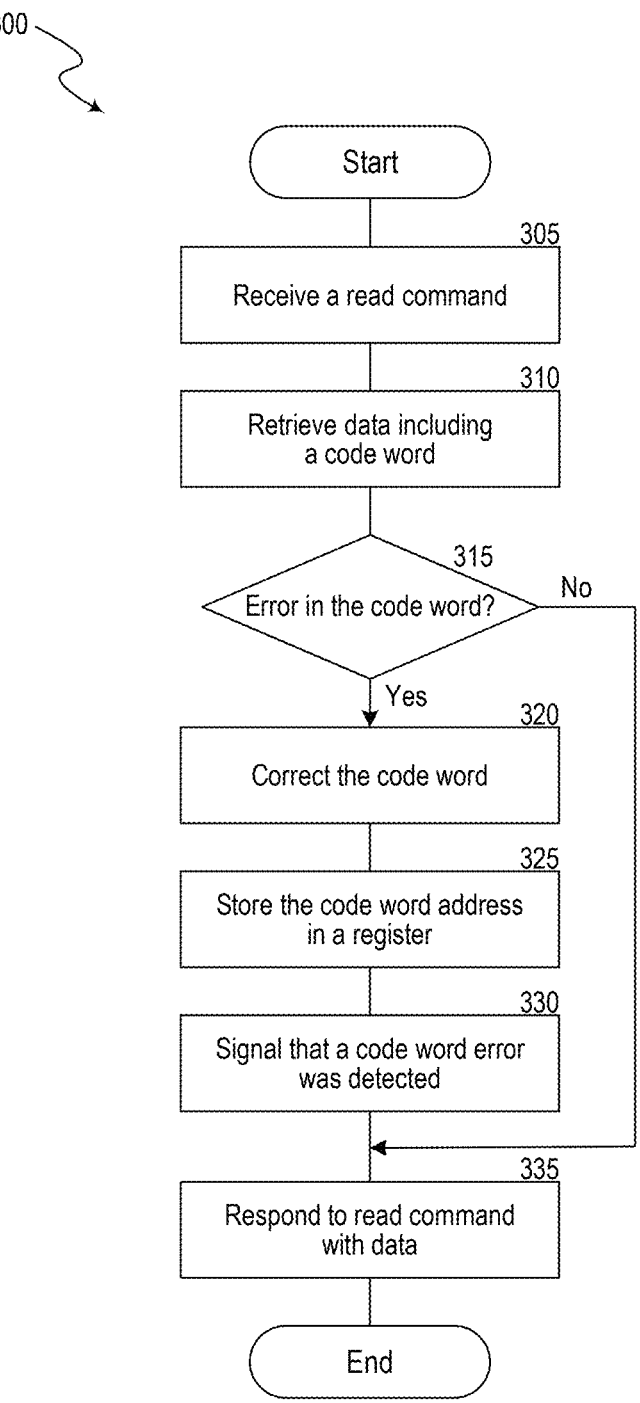
FIG. 3 is an example flow diagram for directing an ECS procedure in accordance with embodiments of the present disclosure.

FIG. 3 is an example flow diagram illustrating a process 300 for directing an ECS procedure in accordance with embodiments of the present disclosure. Aspects of the process 300 can be performed by a memory device, for example, by the memory device 100 of FIG. 1 (including ECS circuit 175), the memory device 210 of FIG. 2 (including the ECS circuit 275 and ECC circuit 220), and/or a combination thereof.

The process 300 begins at block 305, where the memory device receives, from a host device or a controller coupled with the memory device, a read command. The read command may include a target row within a memory array of the memory device.

At block 310, the memory device, in response to receiving the read command, activates the target row of the memory array and retrieves data from the target row. The data may include one or more code words, each of which may correspond to an address (such as a column address) associated with the target row.

At decision block 315, the memory device determines whether any of the code words of the retrieved data include at least one error. In some embodiments, the memory device may utilize an ECC engine to detect any errors in the code words. If the memory device determines that at least one code word has at least one error, then the process continues to block 320. If the memory device determines that none of the code words has any errors, then the process continues to block 335.

At block 320, the memory device (for example using an ECC engine, such as the ECC circuit of FIG. 1 or FIG. 2) corrects the errors in the code words. As described herein, it will be appreciated that the corrections (made in response to the received read command) are reflected in the read data ultimately sent to the requesting host and/or controller but are not written back to the memory array of the memory device.

At block 325, the memory device stores the addresses of code words in which errors were detected (e.g., at decision block 315) to a register. For example, the memory device can store the address to the directed ECS mode registers 235 (discussed in FIG. 2). The address information can include information to access each of the corresponding code words in the memory array, including the bank group, bank, row, and column associated with the code word. In some embodiments in which the memory device can detect errors in multiple code words, the address of each of the code words is stored to a different register. The memory device can also update a valid bit associated with each written-to register to indicate the register has valid data.

At block 330, the memory device signals to the requesting host and/or controller that at least one error was detected in a code word that was retrieved in response to the read command. In embodiments in which the memory device includes a CXL interface to the host and/or controller, the memory device can signal the occurrence of a detected error through a DM pin. In embodiments in which the memory device includes a DDR interface to the host and/or controller, the memory device can signal the occurrence of a detected error through a side band bus. It will be appreciated that the host and/or controller may use the error detection signal to initiate an ECS operation.

At block 335, the memory device responds to the read command with the read data, including any error corrections made (e.g., at block 320). The process 300 then ends.

Figure 4:
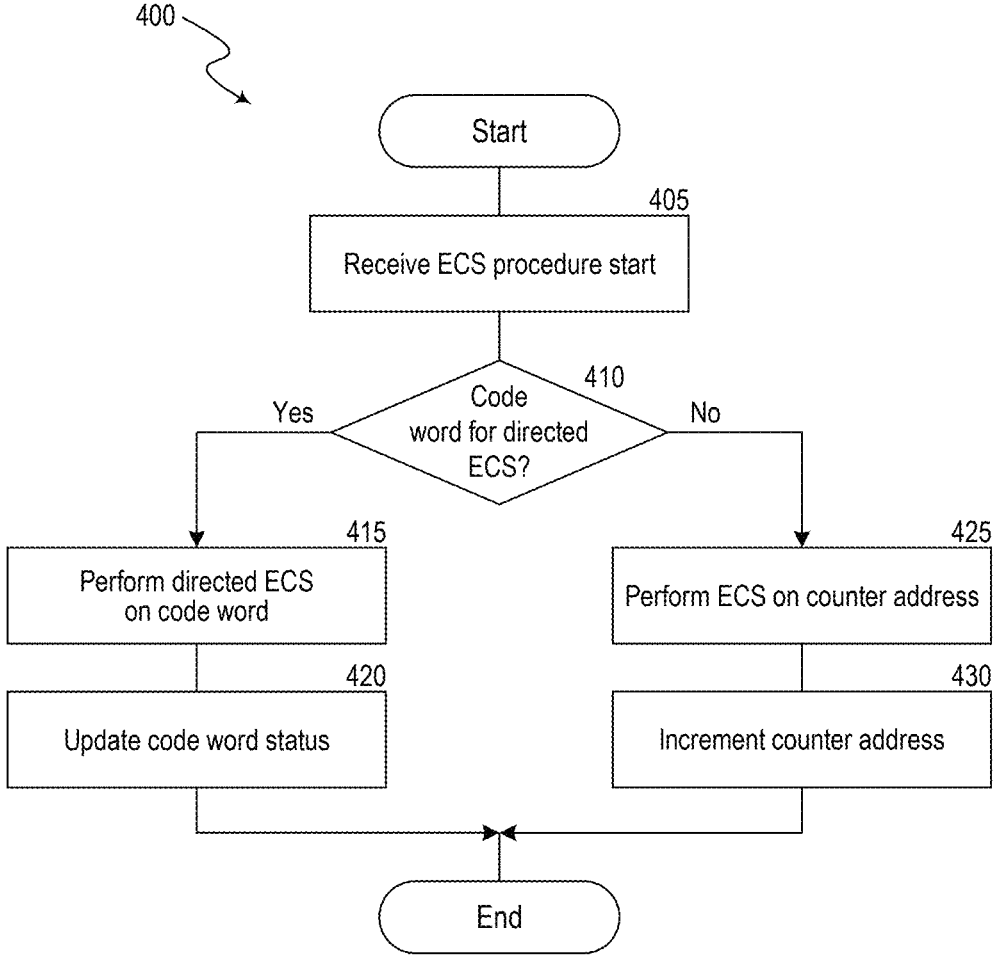
FIG. 4 is an example flow diagram for performing an ECS procedure in accordance with embodiments of the present disclosure.

FIG. 4 is an example flow diagram illustrating a process 400 for performing an ECS procedure in accordance with embodiments of the present disclosure. Aspects of the process 400 can be performed by a memory device, for example, by the memory device 100 of FIG. 1 (including ECS circuit 175), the memory device 210 of FIG. 2 (including the ECS circuit 275 and ECC circuit 220), and/or a combination thereof.

The process 400 begins at block 405, where the memory device receives an indication to start an ECS procedure. For example, the memory device can receive the indication from a host and/or memory controller coupled to the memory device (e.g., it can receive a command to perform manual ECS). As a further example, the memory device can automatically initiate the ECS procedure after a threshold time has elapsed since the last ECS procedure (e.g., it can begin automatic ECS). In some embodiments the memory device initiates automatic ECS with a frequency such that ECS will be performed on the entire memory device within a period of time (e.g., within 24 hours).

At decision block 410, the memory device determines whether there are any code words on which to perform directed ECS. For example, the memory device can include one or more mode registers (e.g., directed ECS mode registers) in which the addresses of code words with a detected error are stored, indicating that directed ECS should be performed on the corresponding code words. The code word addresses can be the address of a memory array in the memory device (e.g., a column, row, bank, and/or bank group) in which the code word is stored. Code word errors can be detected, and the corresponding addresses stored, in connection with responding to a read command received by the memory device (e.g., as described by the process 300 illustrated in FIG. 3). If the memory device determines there is a code word on which to perform directed ECS, the process 400 continues to block 415. If the memory device determines that there are no code words on which to perform directed ECS, the process 400 continues to block 425.

At block 415, the memory device performs a directed ECS procedure on a code word for which an error has been previously detected (e.g., a code word identified by decision block 410). As described herein, the ECS procedure can perform an internal read-modify-write cycle on a code word, in which data from the code word is read from a memory array of the memory device, an ECC function is performed on the read data to identify and correct errors in the data, and the corrected data is written back to the code word's address in the memory array. In some embodiments, the memory device may be capable of storing the location of multiple code words in which an error has been detected (e.g., the memory device may include multiple directed ECS mode registers). In said embodiments, the memory device may perform the directed ECS procedure on any of the code words in which an error has been detected. For example, the memory device may perform the directed ECS procedure on the oldest detected error; that is, the code word for which the most time has elapsed since the error was detected in the code word.

At block 420, the memory device updates status associated with the code word on which the directed ECS procedure was performed. For example, the memory device may clear the valid bit of a directed ECS mode register, storing the address of the code word on which the directed ECS procedure was performed, so that the directed ECS mode register no longer appears as having valid data. That is, the code word on which the directed ECS procedure was performed will no longer present (i.e., at decision block 410) as requiring directed ECS. It will be appreciated that in embodiments in which the memory device stores the location of multiple code words in which an error has been detected (e.g., multiple directed ECS mode registers), other code words may later present as requiring directed ECS (e.g., the next time the memory device receiving a manual ECS request). The process 400 then ends.

If, however, at decision block 410 it was determined that there were no code words on which to perform directed ECS, then at block 425 the memory device performs the ECS procedure on a code word at an address based on ECS address counters. At block 430, the memory device increments the address in the ECS address counters. By doing so, the next time an ECS procedure is performed using the address in the ECS address counters, the ECS procedure will be performed on the next code word in the memory array. As described herein, the ECS address counters may be incremented to iterate through all columns within a row, all rows within a bank, all banks within a bank group, and all back groups, so as to iterate through the address of all code words in the memory array of the memory device over ECS procedures. The process 400 then ends.

Figure 5:
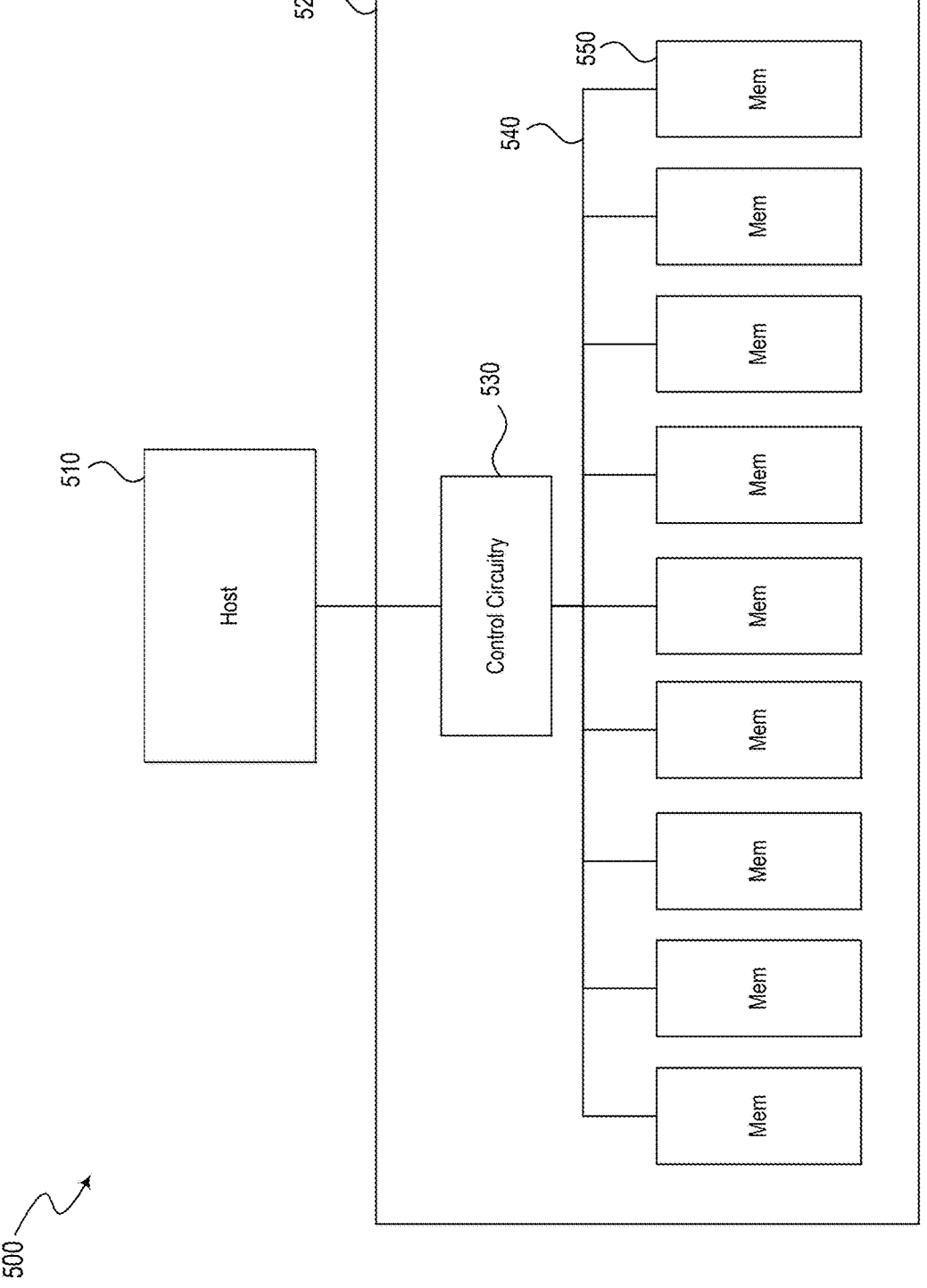
FIG. 5 is a simplified block diagram schematically illustrating an example memory system in accordance with an embodiment of the present disclosure.

FIG. 5 is a simplified block diagram schematically illustrating a memory system 500 in accordance with an embodiment of the present technology. Memory system 500 includes a host device 510 operably coupled to a memory module 520 (e.g., a dual in-line memory module (DIMM)). Memory module 520 can include controller circuitry 530 operably connected by a bus 540 to a plurality of memory devices 550. In accordance with one aspect of the present disclosure, the memory devices 550 can perform a directed ECS procedure in response to initiating automatic ECS or receiving (e.g., from the host 510) a request to perform manual ECS. It will be appreciated that in response to performing ECS (e.g., in response to a request from the host device 510 to perform manual ECS), certain memory devices 550 may perform a directed ECS procedure (e.g., if that memory device 550 previously identified an error in a code word that has not yet been scrubbed) and certain memory devices 500 may perform a conventional ECS procedure using address counters (e.g., if that memory device 550 has not identified an error in a code word that has yet to be scrubbed).

Figure 6:
FIG. 6 is a block diagram of an example computer system in accordance with an embodiment of the present disclosure.
Figure 6:
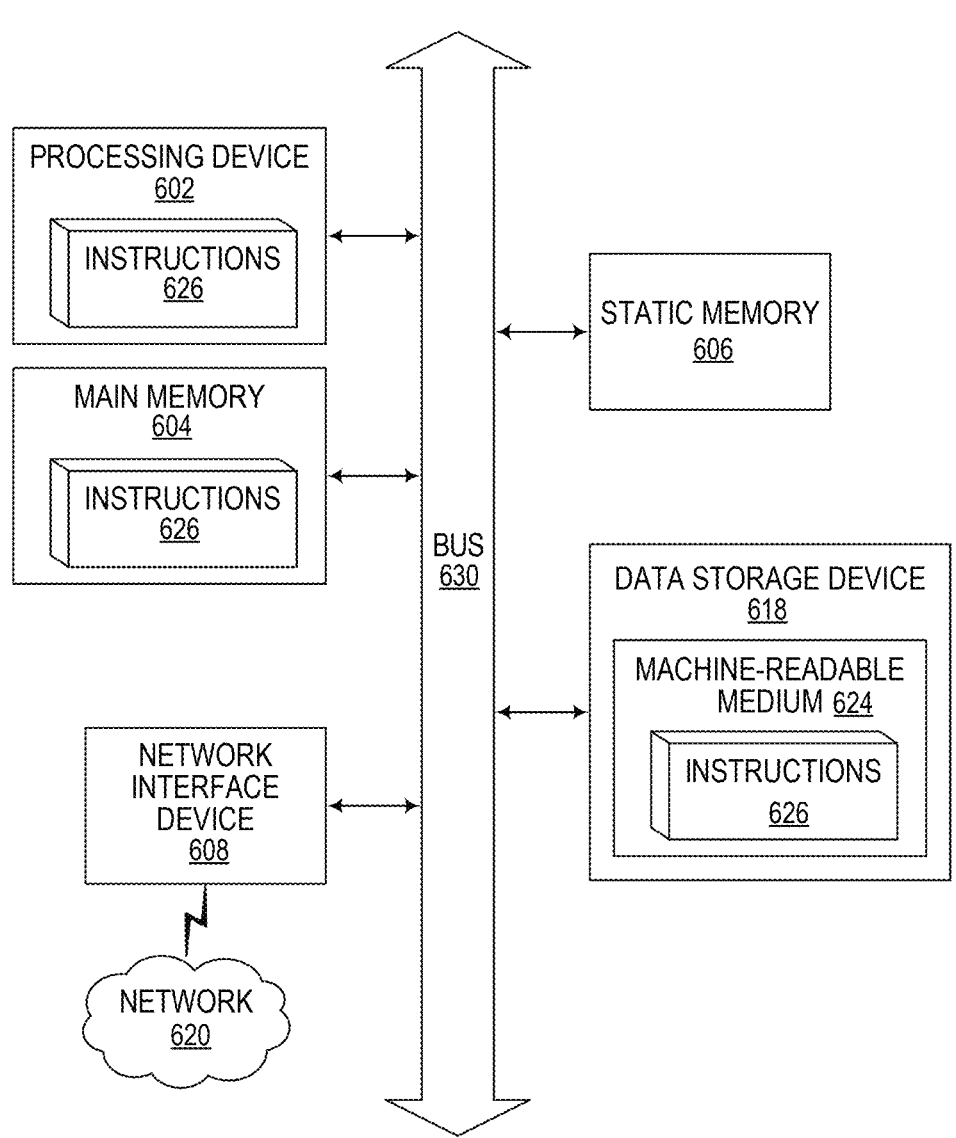

FIG. 6 illustrates an example machine of a computer system 600 within which a set of instructions for causing the machine to perform any one or more of the methodologies discussed herein can be executed. In alternative embodiments, the machine can be connected (e.g., networked) to other machines in a LAN, an intranet, an extranet, and/or the internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630. In accordance with one aspect of the present disclosure, the main memory 604 can perform a directed ECS.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media.

While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate or sub-regions of the substrate may be controlled through doping, using various chemical species including, but not limited to, phosphorus, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

I claim:

1. A memory device comprising:
    a memory array comprising a plurality of code words;
    an error-correction code (ECC) circuit coupled with the memory array;
    a mode register configured to store a code word address and a valid indicator; and
    circuitry coupled with the memory array, the mode register, and the ECC circuit, the circuitry configured to:
    receive, from a host device, an error check and scrub (ECS) command;
    determine, in response to receiving the ECS command and based on the valid indicator of the mode register, that an error was detected in the memory array prior to receiving the ECS command; and
    perform, in response to determining that an error was detected in the memory array prior to receiving the ECS command, an ECS procedure on a code word associated with the error using the ECC circuit, wherein the code word on which the ECS procedure is performed corresponds to the code word address stored in the mode register; and
    a Data Mask (DM) pin configured to transmit an indication to the host device that the error was detected.

2. The memory device of claim 1, wherein the code word address comprises a column address, a row address, a bank address, and a bank group address.

3. The memory device of claim 1, wherein performing the ECS procedure on the code word comprises:
    retrieving the code word from the memory array;
    updating, using the ECC circuit, the retrieved code word based on an ECC function; and
    storing the updated code word to the memory array.

4. The memory device of claim 1, wherein the circuitry is further configured to:
    receive, from the host device, a read command directed to the memory array;
    retrieve, in response to the received read command, data from the memory array, the data comprising a second code word;
    detect at least one error in the second code word using the ECC circuit, wherein the second code word is associated with an address; and
    store the address in a mode register.

5. The memory device of claim 4, wherein determining that an error was detected in the memory array prior to receiving the ECS command is based on the address stored in the mode register, and wherein the code word on which the ECS procedure is performed corresponds to the address stored in the mode register.

6. The memory device of claim 4, wherein the memory device is configured, in response to detecting the at least one error in the second code word, to transmit the indication to the host device.

7. The memory device of claim 6, wherein the memory device further comprises a Compute Express Link (CXL) interface.

8. The memory device of claim 6, wherein the memory device further comprises a DDR6 interface, wherein the DDR6 interface comprises a sideband bus, and wherein the memory device transmits the indication to the host device that an error was detected using the sideband bus.

9. The memory device of claim 1, wherein the circuitry is further configured to clear, after performing the ECS procedure on a code word associated with the error, a valid bit associated with the error.

10. The memory device of claim 1, the memory device further comprising a plurality of mode registers, wherein each mode register is configured to store a code word address and a valid bit, and wherein:

determining that an error was detected in the memory array prior to receiving the ECS command comprises identifying at least one mode register with an asserted valid bit; and performing the ECS procedure comprises selecting one of the identified mode registers, wherein the code word on which the ECS procedure is performed is associated with the code word address stored in the selected mode register.

11. The memory device of claim 10, wherein selecting one of the identified mode registers comprises:

determining, from the identified mode registers, which mode register's valid bit has been asserted the longest; and selecting the mode register with the longest-asserted valid bit.

12. The memory device of claim 10, wherein the circuitry is further configured to perform a plurality of ECS procedures without receiving an ECS command from the host device.

13. The memory device of claim 12, wherein each of the plurality of ECS procedures operates on a different code word than the previous ECS procedure of the plurality of ECS procedures, and wherein the circuitry is further configured to perform the plurality of ECS procedures so that all code words in the memory array are operated on during a 24-hour period.

14. The memory device of claim 1, wherein the circuitry is further configured to:

perform, in response to determining that no error was detected in the memory array prior to receiving the ECS command, an ECS procedure on a second code word, wherein the second code word is associated with an address stored in an address counter.

15. A method comprising:

receiving, at a memory device, a read command from a host device coupled to the memory device;

retrieving, in response to the received read command, data from a memory array of the memory device, wherein the data comprises a code word;

detecting at least one error in the code word of the retrieved data;

storing, in response to detecting the at least one error in the code word, a memory array address associated with the code word to a mode register;

sending, in response to detecting the at least one error in the code word, an indication to the host device that an error was detected in response to the read command, wherein the indication is sent using a Data Mask (DM) pin of the memory device; and performing an internal read-modify-write cycle on the code word associated with the memory array address in the mode register, wherein the internal read-modify-write cycle comprises correcting the at least one error in the code word.

16. The method of claim 15, wherein correcting the at least one error in the code word comprises using an ECC circuit of the memory device.

17. The method of claim 15, the method further comprising:

clearing, after performing the internal read-modify-write cycle on the code word, the memory array address from the mode register.

18. The method of claim 15, wherein the memory device is coupled to the host device via a sideband bus to which at least one other memory device is coupled, and wherein the memory device sends the indication that an error was detected using the sideband bus.

\* \* \* \* \*